United States Patent
Liu et al.

(10) Patent No.: US 6,806,551 B2
(45) Date of Patent: Oct. 19, 2004

(54) FUSE CONSTRUCTION FOR INTEGRATED CIRCUIT STRUCTURE HAVING LOW DIELECTRIC CONSTANT DIELECTRIC MATERIAL

(75) Inventors: Yauh-Ching Liu, Sunnyvale, CA (US); Ruggero Castagnetti, Menlo Park, CA (US); Ramnath Venkatraman, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 72 days.

(21) Appl. No.: 10/376,401

(22) Filed: Feb. 28, 2003

(65) Prior Publication Data

US 2003/0164532 A1 Sep. 4, 2003

Related U.S. Application Data

(62) Division of application No. 09/882,404, filed on Jun. 12, 2001, now Pat. No. 6,566,171.

(51) Int. Cl.[7] .............................................. H01L 29/00
(52) U.S. Cl. ....................................... 257/529; 257/751
(58) Field of Search .............................. 257/529, 209, 257/750, 751; 438/132, 601, FOR 433

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |

(List continued on next page.)

FOREIGN PATENT DOCUMENTS

| | | | |
|---|---|---|---|
| DE | 198 04 375 A1 | 7/1999 | H01L/21/312 |
| EP | 0 706 216 A2 | 4/1996 | H01L/23/532 |
| EP | 0 949 663 A2 | 10/1999 | H01L/21/312 |
| JP | 63003437 | 1/1988 | H01L/21/90 |
| JP | 2000-267128 | 9/2000 | G02F/1/136 |
| WO | WO 99/41423 | 8/1999 | |

OTHER PUBLICATIONS

Bothra, S., et al., "Integration of 0.25 $\mu$m Three and Five Level Interconnect System for High Performance ASIC", *1997 Proceedings Fourteenth International VMIC Conference*, Santa Clara, CA, Jun. 10–12, 1997, pp. 43–48.

(List continued on next page.)

*Primary Examiner*—S. V. Clark
(74) *Attorney, Agent, or Firm*—John P. Taylor

(57) ABSTRACT

Fuses, and optionally metal pads, are formed over a layer of low k dielectric material structure having first openings lined with conductive barrier material and filled to form metal interconnects in the upper surface of the low k dielectric material. A dielectric layer is formed over the low k dielectric material and over the metal interconnects, and patterned to form second openings therein communicating with the metal interconnects. A conductive barrier layer is formed over this dielectric layer in contact with the metal interconnects, and patterned to form fuse portions between some of the metal interconnects, and a liner over one or more of the metal interconnects. A dielectric layer is then formed over the patterned conductive barrier layer to form a window above each fuse, and patterned to form openings over at least some of the conductive barrier liners filled with metal to form metal pads.

4 Claims, 6 Drawing Sheets

U.S. PATENT DOCUMENTS

| | | | | |
|---|---|---|---|---|
| 5,376,595 | A | 12/1994 | Zupancic et al. | 501/12 |
| 5,470,801 | A | 11/1995 | Kapoor et al. | 437/238 |
| 5,558,718 | A | 9/1996 | Leung | 118/723 E |
| 5,559,367 | A | 9/1996 | Cohen et al. | 257/77 |
| 5,580,429 | A | 12/1996 | Chan et al. | 204/192.38 |
| 5,628,871 | A | 5/1997 | Shinagawa | 438/514 |
| 5,675,187 | A | 10/1997 | Numata et al. | 257/758 |
| 5,688,724 | A | 11/1997 | Yoon et al. | 437/235 |
| 5,753,539 | A | 5/1998 | Okazaki | 438/132 |
| 5,858,879 | A | 1/1999 | Chao et al. | 438/725 |
| 5,864,172 | A | 1/1999 | Kapoor et al. | 257/634 |
| 5,874,367 | A | 2/1999 | Dobson | 438/787 |
| 5,874,745 | A | 2/1999 | Kuo | 257/59 |
| 5,882,489 | A | 3/1999 | Bersin et al. | 204/192.35 |
| 5,904,154 | A | 5/1999 | Chien et al. | 134/1.2 |
| 5,915,203 | A | 6/1999 | Sengupta et al. | 438/669 |
| 5,939,763 | A | 8/1999 | Hao et al. | 257/411 |
| 6,025,263 | A | 2/2000 | Tsai et al. | 438/624 |
| 6,028,015 | A | 2/2000 | Wang et al. | 438/789 |
| 6,037,248 | A | 3/2000 | Ahn | 438/619 |
| 6,037,648 | A | 3/2000 | Arndt et al. | 257/529 |
| 6,043,167 | A | 3/2000 | Lee et al. | 438/789 |
| 6,051,073 | A | 4/2000 | Chu et al. | 118/723 |
| 6,051,477 | A | 4/2000 | Nam | 438/404 |
| 6,066,574 | A | 5/2000 | You et al. | 438/781 |
| 6,114,259 | A | 9/2000 | Sukharev et al. | 438/789 |
| 6,147,012 | A | 11/2000 | Sukharev et al. | 438/787 |
| 6,153,524 | A | 11/2000 | Henley et al. | 438/691 |
| 6,204,192 | B1 | 3/2001 | Zhao et al. | 438/723 |
| 6,214,630 | B1 | 4/2001 | Hsuan et al. | 438/11 |
| 6,232,658 | B1 | 5/2001 | Catabay et al. | 257/701 |
| 6,235,557 | B1 | 5/2001 | Manley | 438/132 |
| 6,274,483 | B1 * | 8/2001 | Chang et al. | 438/640 |
| 6,316,350 | B1 * | 11/2001 | Eissa et al. | 438/637 |
| 6,458,645 | B2 | 10/2002 | DeBoer et al. | 438/240 |
| 6,664,141 | B1 * | 12/2003 | Castagnetti et al. | 438/132 |
| 6,667,533 | B2 * | 12/2003 | Daubenspeck et al. | 257/529 |
| 2001/0042897 | A1 | 11/2001 | Yeh et al. | 257/529 |
| 2002/0005582 | A1 | 1/2002 | Nogami et al. | 257/758 |
| 2002/0058462 | A1 | 5/2002 | Oliver et al. | 451/36 |

OTHER PUBLICATIONS

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

Sugahara, Satoshi, et al., "Chemical Vapor Deposition of $CF_3$–Incorporated Silica Films for Interlayer Dielectric Application", 1999 Joint International Meeting, *Eletrochemical Society Meeting Abstracts*, vol. 99–2, 1999, Abstract No. 746.

Koda, Seiichiro, et al., "A Study of Inhibition Effects for Silane Combustion by Additive Gases", *Combustion and Flame*, vol. 73, No. 2, Aug., 1988, pp. 187–194.

* cited by examiner

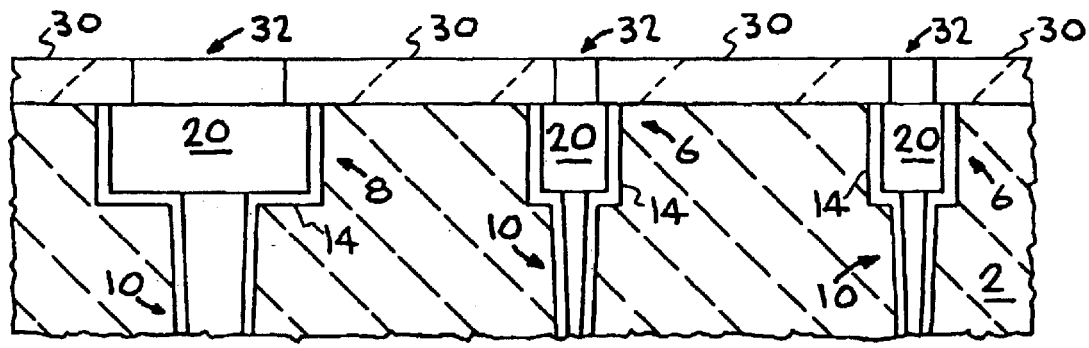
FIG. 4
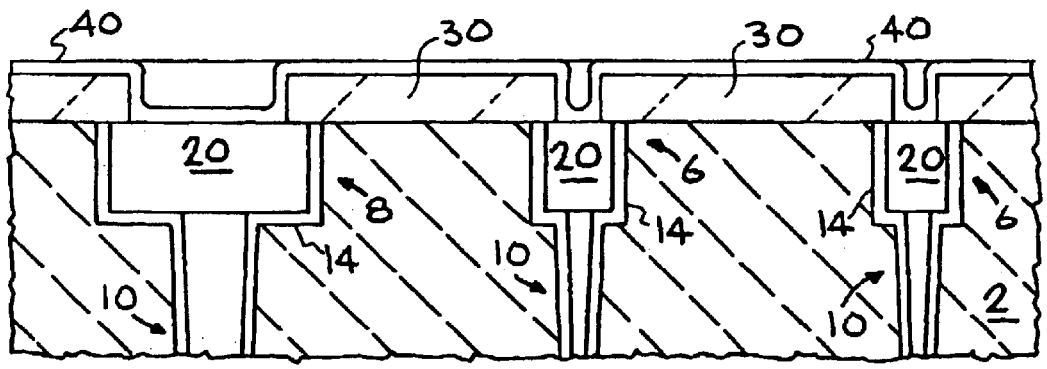
FIG. 5
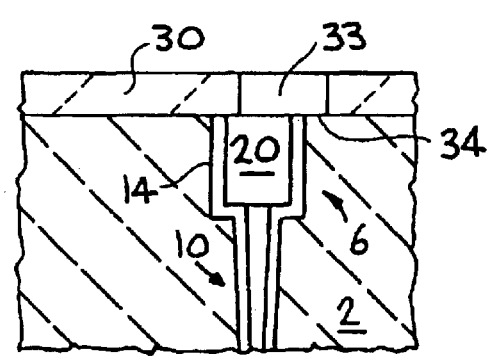 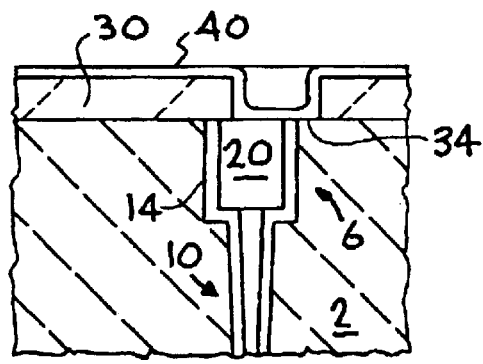
FIG. 4A  FIG. 5A

FUSE CONSTRUCTION FOR INTEGRATED CIRCUIT STRUCTURE HAVING LOW DIELECTRIC CONSTANT DIELECTRIC MATERIAL

Divisional of prior application Ser. No. 09/882,404, filed Jun. 6, 2001, now U.S. Pat. No. 6,566,178

BACKGROUND OF THE INVENTION

1. Field of the Invention

This invention relates to a fuse construction for integrated circuit structures. More particularly this invention relates to construction of a fuse useful in integrated circuit structures having one or more layers of low k dielectric material and optionally also containing copper interconnects.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U. K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The incorporation of such low dielectric constant (low k) carbon-doped silicon oxide dielectric material into interconnect architecture has been very attractive not only because of the low k properties, but also because of the compatibility with conventional silicon process technologies. Generally these materials remain stable upon annealing at temperatures of up to 500° C. Such carbon doped silicon oxide dielectric materials are characterized by the structure of amorphous silicon oxide with incorporated methyl groups and hydrogen species, and are also characterized by a reduced density in comparison with conventional silicon oxide that can be explained by the formation of microporosity surrounding the incorporated methyl groups. Furthermore, such hydrocarbon-modified silicon oxide dielectric materials deposited by CVD techniques are also characterized by strong adhesion.

However, such low k carbon-doped silicon oxide dielectric material are susceptible to deleterious reaction with moisture when the low k material is exposed to the air, such as when a via is etched through a layer of such low k dielectric material, or when a fuse, mounted on the upper surface of a layer of the low k dielectric material, is blown. The reaction materials or byproducts resulting from reaction of the low k dielectric material with moisture can result in failures in subsequent assembly processing of the integrated circuit structure.

The above-mentioned shrinking of integrated circuits and resultant increase in capacitance and loss in speed has also resulted in a renewed interest in the utilization of higher conductivity materials such as copper for via filling or for forming the metal interconnects or "wiring" used in the integrated circuit structure because of its superior electrical conductivity compared to conventional metals used for these purposes such as aluminum or tungsten. When copper is utilized for this purpose it conventionally is also used for the formation of blowable fuses as well, as a matter of process efficiency.

However, copper, like the above-discussed low k dielectric material, is also susceptible to reaction with moisture when exposed to air. In the construction of copper fuses used, for example, in ASIC (Application Specific Integration Circuits) technology, blowing of the fuse by a laser beam can result in creation of an opening or hole which can expose the remnants of the copper fuse (as well as an underlying layer of low k dielectric material) to air. The resultant reaction between the copper and the moisture in the air tends to make the copper regrow, thereby reconnecting the blown fuse and consequently, for example, causing data error in the embedded memory of an ASIC device.

It would, therefore, be desirable to provide a fuse structure and process for forming same wherein such problems can be eliminated in an integrated circuit structure which contains low k dielectric material and optionally copper metal interconnects and/or copper-filled vias as well, while still maintaining process efficiencies, thereby permitting the benefits of the use of low k dielectric materials and optionally also copper-filled vias and/or copper metal interconnects.

SUMMARY OF THE INVENTION

In accordance with the invention fuses, and optionally metal pads, are formed over a layer of low k dielectric material in an integrated circuit structure by first providing, over portions of an integrated circuit structure, a layer of low k dielectric material, the layer of low k dielectric material having first openings in an upper surface thereof lined with a first conductive barrier material and filled with a filler metal such as copper, to form metal interconnects in the upper surface of the layer of low k dielectric material; forming a first dielectric layer over the layer of low k dielectric material and over the metal interconnects in the upper surface of the layer of low k dielectric material patterning the first dielectric layer to form second openings therein communicating with the metal interconnects in the first openings in the layer of low k dielectric material; forming a second conductive barrier layer over the first dielectric layer and in contact with the metal interconnects exposed by the patterning of the first dielectric layer; patterning the second conductive barrier layer to form fuse portions between some of the metal interconnects, and to form a liner over one or more of the metal interconnects; and forming a second dielectric layer over the patterned conductive barrier metal layer to thereby form a window of second dielectric material above each of the fuse portions.

Preferably, the process includes the further steps of patterning the second dielectric layer to form a third opening over at least some of the liners of conductive barrier material over the metal interconnects; and filling the third openings with metal to form metal pads, each in electrical contact with a metal interconnect through a liner.

BRIEF DESCRIPTION OF THE DRAWINGS

FIG. 4 is a fragmentary vertical side-section view of the structure of FIG. 3 after patterning of the first dielectric layer to expose the metal interconnects in the layer of low k dielectric material.

FIG. 4A is a fragmentary vertical side-section view of the structure of FIG. 3 after patterning of the first dielectric layer wherein the patterning is misaligned to expose a portion of the low k dielectric material.

FIG. 5 is a fragmentary vertical side-section view of the structure of FIG. 4 after blanket deposition of a second conductive barrier layer over the structure of FIG. 4, including the exposed metal interconnects in the layer of low k dielectric material.

FIG. 5A is a fragmentary vertical side-section view of the structure of FIG. 4A after deposition of a second conductive barrier layer over the structure of FIG. 4A, including not only the exposed metal interconnects in the layer of low k dielectric material, but also over the exposed portion of the layer of low k dielectric material as well.

DETAILED DESCRIPTION OF THE INVENTION

This invention relates to the constructing of a fuse for integrated circuit structures having one or more layers of low k dielectric material and optionally also containing copper interconnects. By use of the term "low k dielectric material" is meant a dielectric material having a dielectric constant k which is below 3.5, and most preferably below 3.0.

The low k dielectric material referred to herein may comprise a carbon-doped silicon oxide dielectric material, formed as the reaction product of an oxidizing agent, such as, for example, $O_2$, $O_3$, NO, $NO_2$, or $H_2O_2$, or mixtures of same and an organo-substituted silane. Such a low k carbon-doped silicon oxide dielectric material, for example, may be formed using methyl silane ($CH_3SiH_3$), as described in the previously referenced Peters and McClatcie et al. articles. Alternatively, the low k carbon-doped silicon oxide dielectric material may also comprise, for example, the reaction product of an oxidizing agent with a multiple carbon-substituted silane such as described in U.S. Pat. No. 6,303,047, issued Oct. 16, 2001, assigned to the assignee of this invention, the subject matter of which is hereby is incorporated by reference. The low k carbon-doped silicon oxide dielectric material might also comprise the reaction product of an oxidizing agent and an organofluoro silane such as described in U.S. Pat. No. 6,365,528, issued Apr. 2, 2002; U.S. Pat. No. 6,572,925, issued Jun. 3, 2003, and U.S. Pat. No. 6,649,219, issued Nov. 18, 2003, and in Serial No. 09/792,685; all filed on Feb. 23, 2001. All four of these cases are assigned to the assignee of this application, and the subject matter of all four cases is hereby incorporated by reference.

Figure 1:
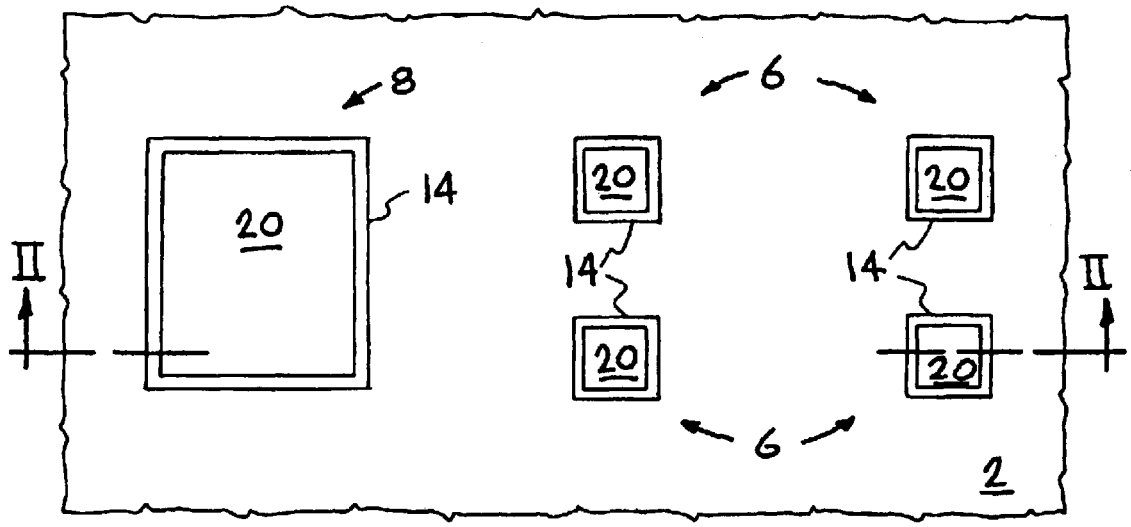
FIG. 1 is a fragmentary top view of an integrated circuit structure showing a layer of low k dielectric material having openings in the top surface lined with a first conductive barrier liner and filled with a filler metal to form metal interconnects.
Figure 2:
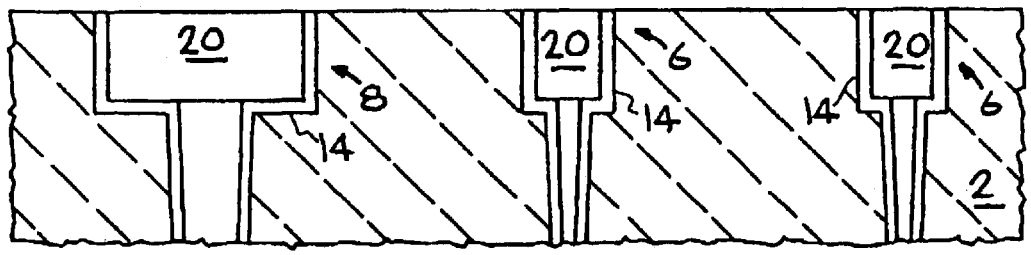
FIG. 2 is a fragmentary vertical side-section view of a portion of the structure of FIG. 1 taken along lines II—II.

Turning now to FIGS. 1 and 2, a layer 2 of low k dielectric material is shown having first openings 6 and 8 provided in the top surface thereof for the formation of mets interconnects. First openings 6 and 8 may, in turn, be formed in registry with vias 10 formed in low k dielectric layer 2 beneath openings 6 and 8 to interconnect the metal interconnec to be formed respectively in openings 6 and 8 with underlying portions of an integrated circuit structure (not shown). First openings 6 and 8 and vias 10 may be formed by the well known dual damascene process, in which case it will be understood that layer 2 of low k dielectric material illustrated in the drawings, including FIGS. 1 and 2, may actually comprise two layers of low k dielectric material.

Openings 6 and 8 are shown filled with electrically conductive material comprising a liner of first conductive barrier material 14 and a filler metal 20 such as copper. Conductive barrier liner 14 isolates copper filler metal 20 from the low k dielectric material of layer 2 exposed by the formation of openings 6 and 8. Filled opening 8 comprises a metal interconnect which will be used to make external electrical connection to the integrated circuit structure from a metal pad to be formed, while filled openings 6 comprises metal interconnects which will be used in connection with the formation of blowable fuses, as will be described below.

Conductive barrier material 14 may comprise tantalum metal, tantalum nitride, or a dual layer of tantalum metal and tantalum nitride, with the tantalum metal layer in contact with the low k dielectric material, to facilitate adherence thereto, and the tantalum nitride layer serving as a barrier material to isolate the low k dielectric material from the copper filler layer. Alternatively, for example when the filler layer comprises tungsten, titanium nitride may be used as the barrier layer, either alone or in combination with a titanium metal layer used principally as the adhesion layer to adhere the titanium nitride layer to the low k dielectric layer. Conductive barrier layer 14 will range in thickness from about 10 nanometers (nm) to about 250 nm, and preferably will range in thickness from about 20 nm to about 100 nm.

Figure 3:
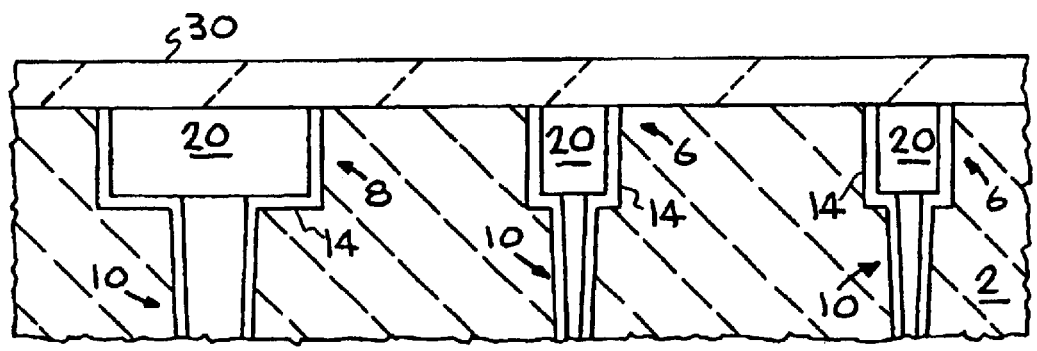
FIG. 3 is a fragmentary vertical side-section view of the structure of FIGS. 1 and 2 after blanket formation of a first dielectric layer over the structure of FIGS. 1 and 2.

FIG. 3 shows a blanket deposition of a first dielectric layer 30 over the upper surface of the structure of FIGS. 1 and 2, while FIG. 4 shows first dielectric layer 30 patterned to form second openings therein 32 in registry with filled openings 6 and 8. It should be noted that while it is preferred that second openings 32 be formed in registry with filled underlying first openings 6 and 8 comprising the metal interconnects, this is not a necessity, as shown in FIG. 4A. In FIG. 4A, second opening 33 of patterned first dielectric layer 30 is sufficiently out of registry with first opening 6 in layer 2 of low k dielectric material so as to expose a portion of layer 2 at 34. However, as will be seen and described below with respect to FIG. 5A, such slight misregistry can be tolerated in the structure of the invention.

First dielectric layer 30 may comprise a dielectric material such as, for example, silicon nitride or silicon carbide, and (at least in some instances) silicon oxide. The thickness of first dielectric layer 30 will range in thickness from about 50 nm to about 1000 nm, and preferably will range in thickness from about 100 nm to about 500 nm.

As shown in FIG. 5, a second layer of electrically conductive barrier material 40 is then blanket deposited over the entire structure. Second layer of conductive barrier material 40 may comprise any of the conductive barrier materials previously described for liner 14 of first conductive barrier material, i.e., tantalum metal, tantalum nitride, or a dual layer of tantalum nitride and tantalum metal (with the tantalum metal layer in contact with the low k layer). Other electrically conductive barrier materials may be used for second layer of conductive barrier material 40, such as titanium, titanium nitride, and dual layers of titanium and titanium nitride with the titanium metal in contact with the metal pad to be formed over a portion of second layer of electrically conductive barrier material 40, as will be discussed below. Tantalum nitride, however, is the electrically conductive barrier material of choice when layer 40 will contact copper metal.

However, liner 14 and layer 40 need not comprise the same conductive barrier material. As seen in FIG. 5A, when slight misregistry of second opening 33 in first dielectric layer 30 exists, with respect to filled first opening 6, the result is contact between second layer of conductive barrier material 40 and portion 34 of layer 2 of low k dielectric material. However, this is not a problem since second barrier layer 40 comprises a material which may be in contact with the low k dielectric material of layer 2 without deleterious consequences.

Figure 6:
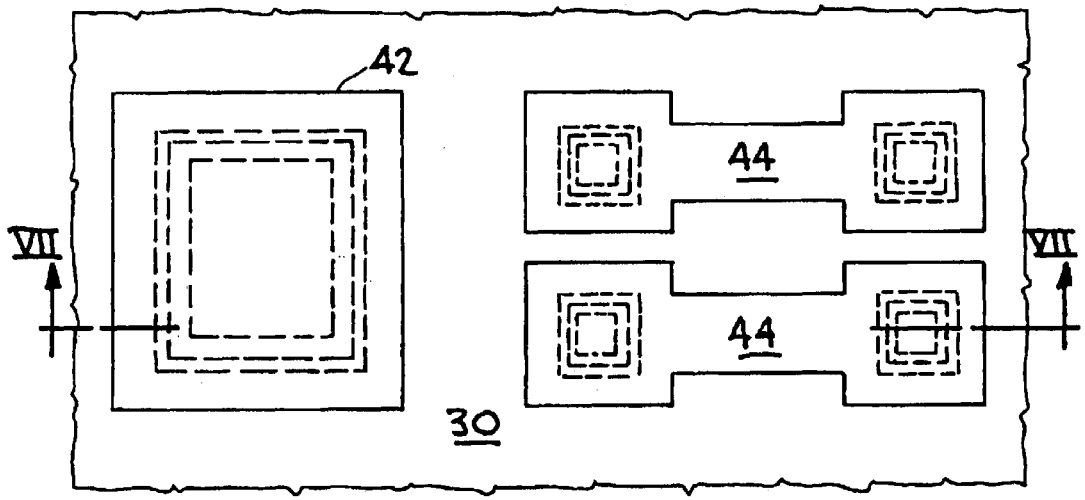
FIG. 6 is a fragmentary top view of the structure of FIG. 5 after patterning the second conductive barrier layer to form fuse portions, and a liner, over the exposed metal interconnects.
Figure 7:
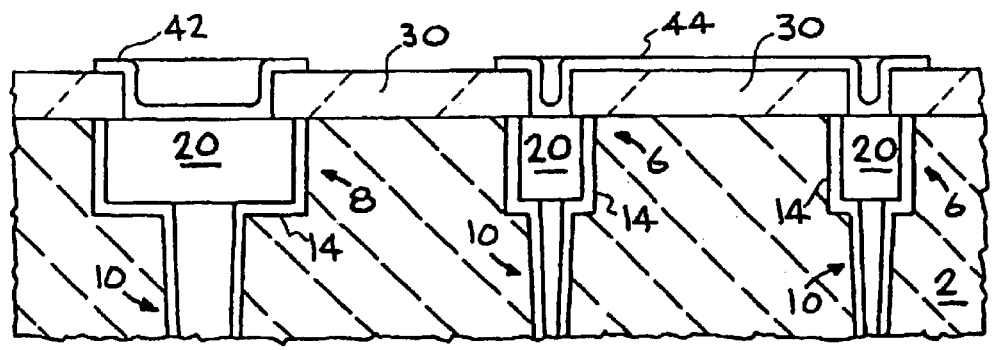
FIG. 7 is a fragmentary vertical side-section view of a portion of the structure of FIG. 6 taken along lines VII—VII.

Second layer 40 of electrically conductive barrier material is then patterned to form liner 42 over and in contact with the metal interconnect comprising filled first opening 8, and to form fuse 44 over the metal interconnects comprising filled first openings 6, as seen in FIGS. 6 and 7.

Figure 8:
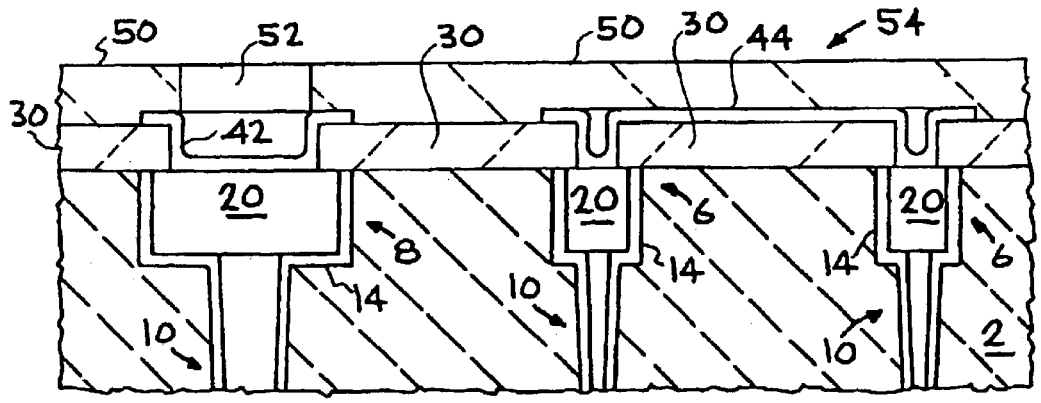
FIG. 8 is a fragmentary vertical side-section view of the structure of FIGS. 6 and 7 after blanket deposition of a second dielectric layer over the structure of FIGS. 6 and 7 to form a window over each fuse portion, and patterning of the second dielectric layer to form an opening in the second dielectric layer down to the conductive metal barrier liner over the metal interconnect.

Second dielectric layer 50 is then blanket deposited over the structure to form a protective window 54 over fuses 44, as shown in FIG. 8. Second dielectric layer 50 may comprise the same dielectric material used to form first dielectric layer 30 unless subsequent etch selectivity is desired between layer 30 and layer 50. In such a case one dielectric material may be used for first dielectric layer 30, e.g., silicon carbide; while another dielectric material is used for second dielectric layer 50, e.g., silicon nitride. After deposition, second dielectric layer 50 is then patterned to form a third opening 52 which extends down to and exposes liner 42. It should be noted that the thickness of second dielectric layer 50 will be governed, at least in part, by the desired thickness of window 54 over fuses 44. That thickness will be sufficient to protect adjacent fuses from damage when a selected fuse is blown, for example, by a laser, yet not so thick as to interfere with blowing of the selected fuse. Preferably, the thickness of window 54 will range from about 100 nanometer (nm) to about 1000 nm- or 1 micrometer ($\mu$m). Most preferably, the window thickness will range from about 100 nm to about 500 nm.

Figure 9:
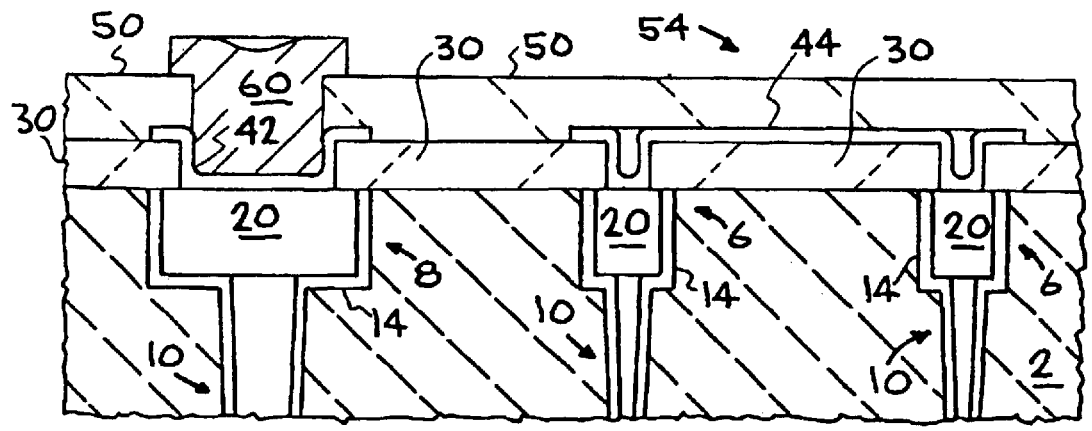
FIG. 9 is a fragmentary vertical side-section view of the structure of FIG. 8 after blanket deposition of a second conductive metal over the second dielectric layer, including filling the openings in the second dielectric layer with the second conductive metal, and then patterning the second conductive metal layer to form a metal pad in electrical contact with the liner and metal interconnect below the liner.

A layer of a conductive metal such as aluminum (or tungsten or gold) is then deposited over the structure and to fill third opening 52 to form a metal pad. The layer of conductive metal may then be patterned (masked and etched) to form metal pad 60 in opening 52 down to, and in contact with, liner 42, as shown in FIG. 9. While this can complete the process, optionally metal pad 60 may be planarized, e.g., by a CMP process, down to the level of the surface of second dielectric layer 50, as shown at 62 in FIG. 10. This CMP step may also be used to adjust the thickness of layer 50 and window 54, if desired, as respectively shown at 50' and 54' in FIG. 10. However, it is preferred to control the thickness of window 54 by control of the thickness of second dielectric layer 50 during the deposition of layer 50 (and window 54), since the deposition is deemed to be more accurate than a subsequent etch/polish step.

Figure 10:
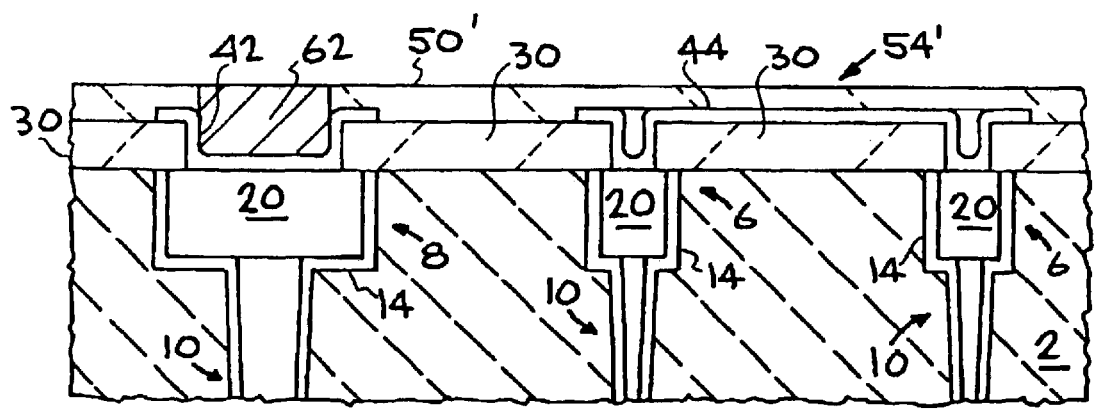
FIG. 10 is a fragmentary vertical side-section view of the structure of FIG. 9 after optional CMP processing to planarize the metal pad and to adjust the thickness of the second dielectric layer over the fuse.

In a preferred embodiment, the masking and etching of the metal layer to form the structure with metal pad 60 thereon, as shown in FIG. 9, may be eliminated, and the subsequent CMP step to provide the planarized structure of FIG. 10, may be consolidated into a single CMP step which removes all of the aluminum layer, leaving only aluminum pad 62, using dielectric layer 50 as an etch stop layer.

Figure 11:
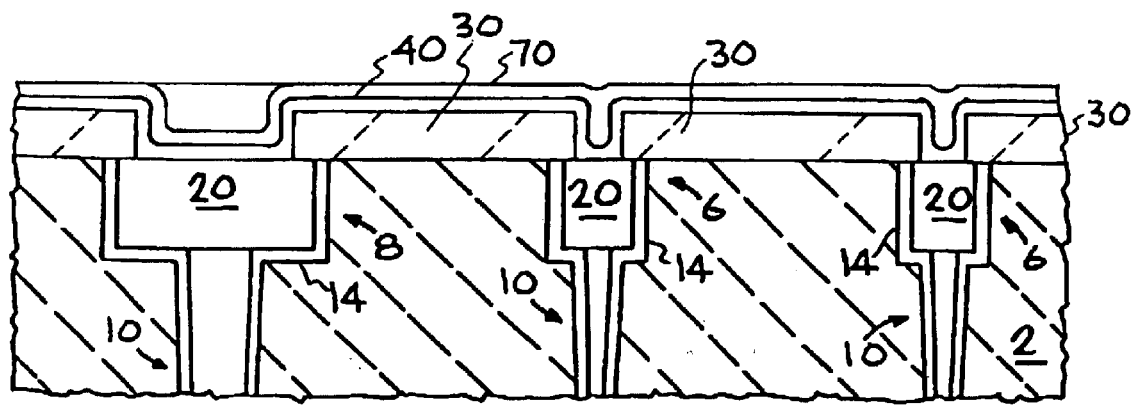
FIG. 11 is a fragmentary vertical side-section view of a second embodiment showing the structure of FIG. 5 after blanket deposition of an etch stop layer over the blanket second layer of conductive barrier material.

Turning now to FIGS. 11–15, another embodiment is shown wherein the window over the fuse is formed of a separate layer of accurately deposited thickness which may also serve as an etch stop layer. As shown in FIG. 11, the structure of FIG. 5 is shown having etch stop layer 70 blanket deposited over second conductive barrier layer 40. Etch stop layer 70 comprise a dielectric material which is preferably different from first dielectric layer 30 to permit layer 70 to function as an etch stop layer as well as a window over fuse 44. For example, if first dielectric layer 30 comprises silicon nitride, then etch stop layer 70 may comprise silicon oxide or silicon carbide. Since etch stop layer 70 will function as the window over fuse 44 to be formed from second conductive barrier layer 40, the thickness of layer 70 in this embodiment will be generally about the same as the thickness of second dielectric layer 50 in the prior embodiment and for the same reasons. That is, thickness of layer 70 (and window 74 to be formed therefrom) will be sufficient to protect adjacent fuses from damage when a selected fuse is blown, for example, by a laser, yet not so thick as to interfere with blowing of the selected fuse. Preferably, the thickness of layer 70 (and window 74) will range from about 100 nm to about 1000 nm- or 1 μm. Most preferably, the thickness will range from about 100 nm to about 500 nm.

Figure 12:
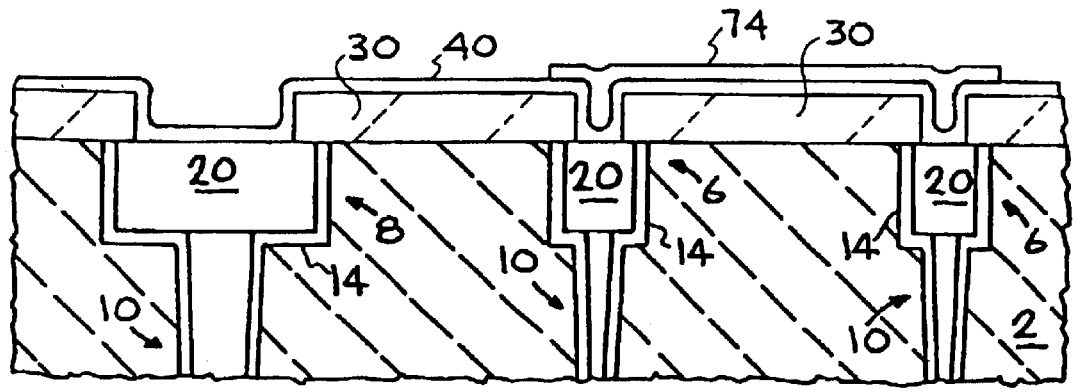
FIG. 12 is a fragmentary vertical side-section view of the structure of FIG. 11 after patterning of the etch stop layer to provide a window over the portion of the underlying second layer of conductive barrier material where the fuses will be formed.
Figure 13:
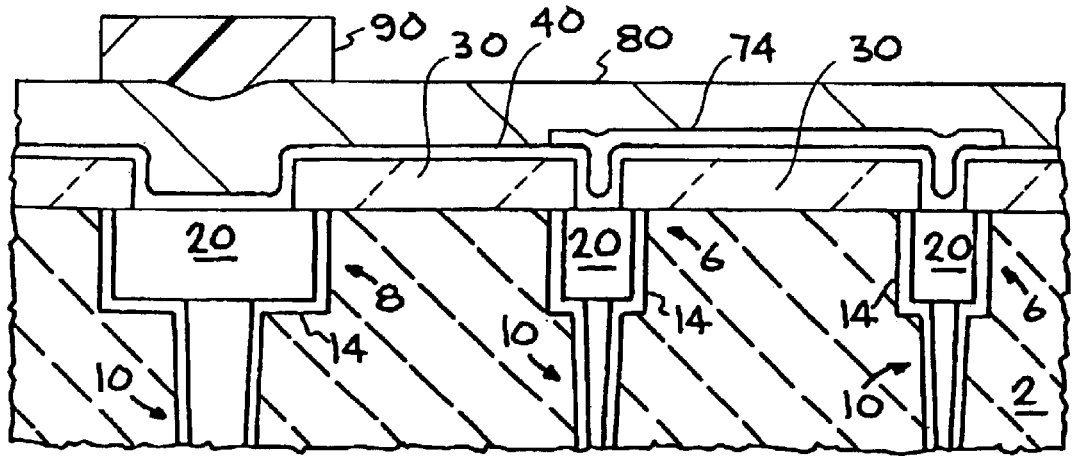
FIG. 13 is a fragmentary vertical side-section view of the structure of FIG. 12 after patterning of the fuse window layer, blanket depostion of metal layer and resist mask over metal layer.
Figure 14:
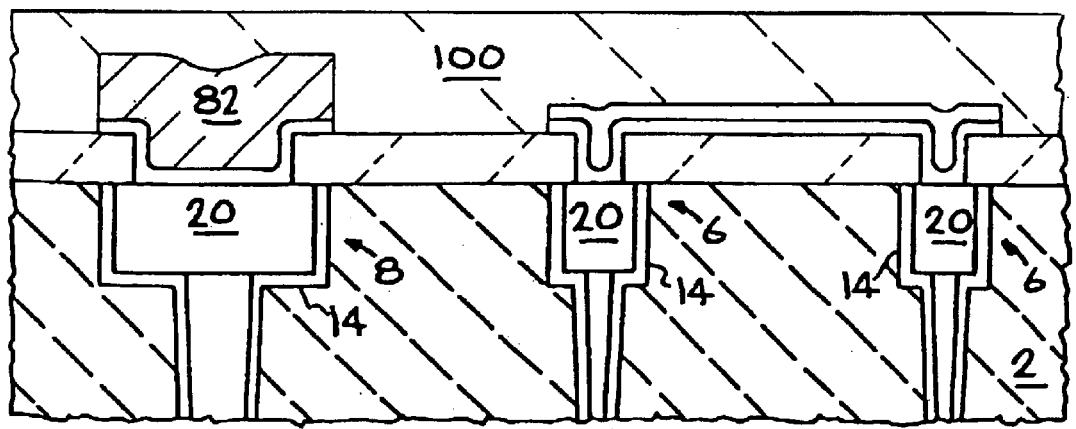
FIG. 14 is a fragmentary vertical side-section view of the structure of FIG. 13 after patterning of the metal layer, the fuse and liner layer, and formation of a further dielectric layer over the structure.
Figure 15:
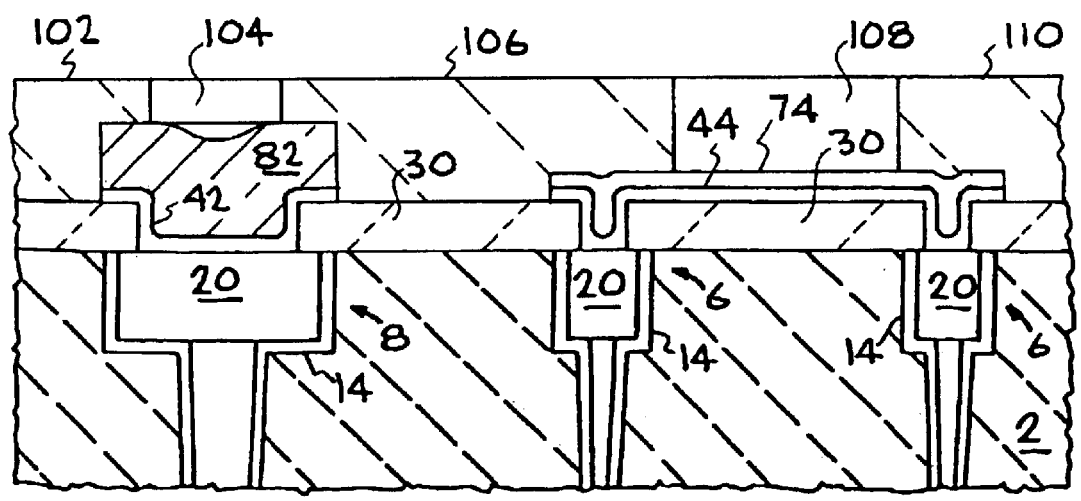
FIG. 15 is a fragmentary vertical side-section view of the structure of FIG. 14 after patterning of the further dielectric layer to form an opening down to the metal pad and an opening down to the fuse window.

FIG. 12 shows the structure of FIG. 11 after patterning of etch stop layer 70 to form window 74 over the fuse to be formed from underlying second conductive barrier layer 40, with the remainder of etch stop layer 70 removed. After formation of window 74, a metal layer 80, such as aluminum, is blanket deposited over the structure, as shown in FIG. 13, and a photoresist mask 90 is formed over metal layer 80 to define a metal pad (shown at 82 in FIG. 14) to be formed by patterning metal layer 80. Metal layer 80 is then etched to remove all exposed portions, leaving metal pad 82 beneath mask 90, as shown in FIG. 14. At the same time, using the same or a different etching system, the exposed portions of second conductive barrier layer 40 are also etched away, as shown in FIG. 14, leaving fuse 44 beneath window 74 and liner 42 beneath metal pad 82, with resist mask and metal pad 82 functioning as a mask to form liner 42; and window 74 acting as a mask or etch stop layer for the removal of the exposed portion of barrier layer 40 and formation of fuse portion 44 beneath window 74.

A further dielectric layer 100 is then blanket deposited over the structure. The dielectric material comprising dielectric layer 100 is chosen to comprise a material with differing etch characteristics from layer 70 from which fuse window 74 was formed to permit window 74 to function as an etch stop during subsequent etching of dielectric layer 100. Dielectric layer 100 is subsequently patterned to form an opening 104 over metal pad 82 and a second opening 108 over fuse window 74, leaving the remainder of dielectric layer 100 as illustrated portions 102, 106, and 110 in FIG. 15. Dielectric layer 100 may be patterned using two masks, with all of layer 100 masked except an opening over metal pad 82 to permit selective etching of opening 104 through barrier layer 100 down to metal pad 82. After removal of the first mask, a second mask is then formed with an opening therein over fuse 44 and window 74 thereon. Dielectric layer 100 is then etched through this opening in the second mask to form an opening 108 which exposes window 74, with window 74 functioning as an etch stop for the etching of dielectric layer 100 to form opening 108.

Thus, the invention provides a process wherein the fuse and the liner beneath the metal pad are formed from the same layer of conductive barrier material, rather than the fuse made of copper as in the prior art. Since a conductive barrier liner would be constructed anyway to provide a liner below the metal pad, process efficiency is achieved as well as superior performance by constructing the fuse of the same conductive barrier layer material. Similarly, the process of the invention also solves the problem of direct contact between the fuse and the layer of low k dielectric material by the placement of a separate (non-low k) dielectric material beneath the fuse so that the blowing of the fuse does not damage the low k dielectric layer.

Having thus described the invention what is claimed is:
1. An integrated circuit structure which includes fuses formed over a low k dielectric layer comprising:
   a) a layer of low k dielectric material formed over portions of an integrate circuit structure, said layer of low k dielectric material having first openings in upper surface thereof lined with a first conductive barrier material and filled with a filler metal to form metal interconnects in said upper surface of said layer of low k dielectric material;
   b) a first dielectric layer formed over said layer of low k dielectric material and over said metal interconnects in said upper surface of said layer of low k dielectric material;
   c) second openings patterned in said first dielectric layer, said second openings communicating with said metal interconnects in said first openings in said layer of low k dielectric material;
   d) a second conductive barrier layer formed over said first dielectric layer and in contact with said metal interconnects exposed by said patterning of said first dielectric layer;
   e) fuse portions patterned from said second conductive barrier layer, said fuse potions located between at least some of said metal interconnects;
   f) a liner also patterned from said second conductive barrier layer, said liner located over one or more of said metal interconnects; and
   g) a second dielectric layer formed over said patterned conductive barrier layer to thereby form a window of second dielectric material above each of said fuse portions.

2. The integrated circuit structure of claim 1 which further includes:
   a) third openings patterned in said second dielectric layer over at least some of said liners of conductive barrier material over said metal interconnects; and
   b) filler metal in said third openings forming metal pads, each in electric contact with a metal interconnect through a liner.

3. An integrated circuit structure which includes fuses formed over a low k dielectric layer in said integrated circuit structure, said integrated circuit structure comprising:
   a) a layer of low k dielectric material formed over portions of said integrated circuit structure;
   b) first openings formed in an upper surface of said layer of low k dielectric material;
   c) a first conductive barrier material formed over the upper surfaces of said first openings;
   d) a filler metal on said first conductive barrier material, which filler metal fills said lined openings to form metal interconnects in said upper surface of said layer of low k dielectric material;
   e) a first dielectric layer formed over said layer of low k dielectric material and over said metal interconnects in said upper surface of said layer of low k dielectric material;
   f) second openings formed in said first dielectric layer in a pattern wherein said second openings communicate with said metal interconnects in said first openings in said layer of low k dielectric material;
   g) a second conductive barrier layer formed over said first dielectric layer and in contact with said metal interconnects exposed by said patterning of said first dielectric layer, said second conductive barrier layer comprising:

i) fuse portions formed between at least some of said metal interconnects; and
  ii) a liner of conductive barrier material formed over one or more of said metal interconnects to provide a barrier between subsequent layers and copper filler material in said metal interconnects beneath said second conductive barrier layer; and
h) a second dielectric layer formed over said patterned conductive barrier layer to thereby form a window of second dielectric material above each of said fuse portions.

4. The integrated circuit structure of claim 3 which further includes:
  a) a pattern of third openings formed in said second dielectric layer over at least some of said liners of conductive barrier material over said metal interconnects; and
  b) metal pads formed by filling said third openings with metal, said metal pads each in electrical contact with one of said metal interconnects through said liner.

* * * * *